United States Patent

Nomura et al.

[11] Patent Number: 5,821,531
[45] Date of Patent: Oct. 13, 1998

[54] DUAL SENSOR ENCODER FOR DETECTING FORWARD/REVERSE ROTATION HAVING LIGHT MODULATING PATTERNS WITH A PREDETERMINED PHASE DIFFERENT

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 773,943

[22] Filed: Dec. 30, 1996

[30] Foreign Application Priority Data

Jan. 26, 1996 [JP] Japan ................................. 8-012317
Mar. 15, 1996 [JP] Japan ................................. 8-059828

[51] Int. Cl.$^6$ ........................................................ G01D 5/34
[52] U.S. Cl. ................................ 250/231.13; 250/231.16
[58] Field of Search .................... 250/231.13, 231.14, 250/231.16, 231.18, 237 R; 356/375, 373, 374; 364/561

[56] References Cited

U.S. PATENT DOCUMENTS

| | | | |
|---|---|---|---|
| 3,098,152 | 7/1963 | Mathes | 250/231.13 |
| 4,449,491 | 5/1984 | Mehnert | 250/231.16 |
| 4,547,667 | 10/1985 | Sasaki et al. | 250/231.16 |
| 5,003,171 | 3/1991 | Paley | 250/231.14 |
| 5,245,476 | 9/1993 | Shono | 359/699 |
| 5,305,220 | 4/1994 | Schoggel | 364/431.03 |

FOREIGN PATENT DOCUMENTS

| | | |
|---|---|---|
| 387710 | 9/1990 | European Pat. Off. . |
| 458775 | 11/1991 | European Pat. Off. . |
| 2217837 | 11/1989 | United Kingdom . |

OTHER PUBLICATIONS

A United Kingdon Search Report, dated Apr. 22, 1997, with UK Application No. 9701463.3.

*Primary Examiner*—Que Le
*Attorney, Agent, or Firm*—Greenblum & Bernstein P.L.C.

[57] ABSTRACT

An encoder for detecting a forward/reverse movement of a rotatable object includes a rotating shaft that is supported on a base and rotates in accordance with the movement of the subject, two rotating disks fixed to the rotating shaft, and two photocouplers mounted on the base which are associated with the disks. Each of said rotating disks is formed with a predetermined light modulating pattern to vary the intensity of light along a circumferential direction. Each of the photocouplers emits a light toward the rotating disk and detects the light modulated by the pattern on the rotating disk. The angular relationship between the rotating disks is selected such that the output signals from the photocouplers due to the rotation of the rotating shaft have a predetermined phase difference.

19 Claims, 16 Drawing Sheets

DUAL SENSOR ENCODER FOR DETECTING FORWARD/REVERSE ROTATION HAVING LIGHT MODULATING PATTERNS WITH A PREDETERMINED PHASE DIFFERENT

BACKGROUND OF THE INVENTION

1. Field of the Invention

The present invention relates to an encoder for detecting the speed of rotation and direction of rotation of a rotating object.

2. Background and Material Information

Conventionally, an encoder is used to detect the amount, speed and direction of rotation of a mechanism when, for example, a motor is used to drive the mechanism. The operation of the mechanism can then be controlled on the basis of the detected values.

A conventional encoder is shown in FIG. 18, and includes a rotating disk 80, provided with radial slits S formed at constant angular intervals around the face of the rotating disk 80, and two photointerrupters 81a and 81b disposed at predetermined positions around the circumference of the rotating disk 80. The photointerrupters 81a and 81b each include a light emitting element and a light receiving element, and the rotating disk 80 is positioned in a gap d formed between the light emitting element and the light receiving element. The photointerrupters 81a and 81b are positioned such that, with respect to the slits S, they output pulse signals having a predetermined phase difference. For example, when the photointerrupters 81a and 81b are positioned at an angle of 94.5° with respect to each other and the angle formed by adjacent slits S on the rotating disk 80 is 18°, as shown in FIG. 19, the output signals from the photointerrupters 81a and 81b will have phase difference by ¼ phase (n/2).

With a conventional encoder, however, it is difficult to accurately set the photointerrupters in order to produce output pulse signals having accurate phase difference. Furthermore, if there is a design change, such that the width or number of slits S on the rotating disk 80 is changed, the mounting angle of the photointerrupters 81a and 81b must also be changed, requiring the complicated redesign of many components.

SUMMARY OF THE INVENTION

It is therefore an object of the present invention to provide an improved encoder for detecting a forward/reverse rotation which allows for easy placement of the photocouplers, such as photointerrupters, while keeping an accurate phase difference between the output signals from the photocouplers.

According to an aspect of the present invention, an encoder for detecting a forward/reverse movement may include a rotating shaft that is supported on a base and rotates in accordance with the movement of the subject, two rotating disks fixed to the rotating shaft, and two photocouplers mounted on the base which are associated with the disks.

The rotating shaft rotates with the rotating disks in accordance with the rotation of the rotating object. Each of the rotating disks is formed with a predetermined light modulating pattern. Each of the photocouplers emits light toward the rotating disk and detects the light modulated by the pattern on the rotating disk.

The angular relationship between the rotating disks is selected such that the output signals from the photocouplers due to the rotation of the rotating shafts have a predetermined phase difference.

With this arrangement, since the two photocouplers are mounted on a same flat surface, the design of, and connection to, a circuit for transmitting output signals is simplified. Furthermore, in terms of design, there is no need to change the mounting of the two photocouplers when changing the number and width of the light modulating pattern on the two rotating disks, as changes are made only to the two rotating disks.

In a particular case, the light modulating pattern may be formed as a plurality of light transmitting parts arranged at constant angular intervals on the opaque surface of the rotating disk. In this case, the photocouplers comprise a photointerrupter to detect the transmitted light through the light transmitting parts.

In another particular case, the light modulating pattern may be formed as a plurality of light reflecting parts arranged at constant angular intervals on the low reflectivity surface of the rotating disk. In this case, each of the photocoupler comprises a photoreflecter to detect the reflected light from the light reflecting parts.

DETAILED DESCRIPTION OF THE PREFERRED EMBODIMENTS

Preferred embodiments of an encoder for detecting forward/reverse rotation of a rear lens group driving motor are described as applied to a lens-shutter type zoom lens camera.

Figure 11:
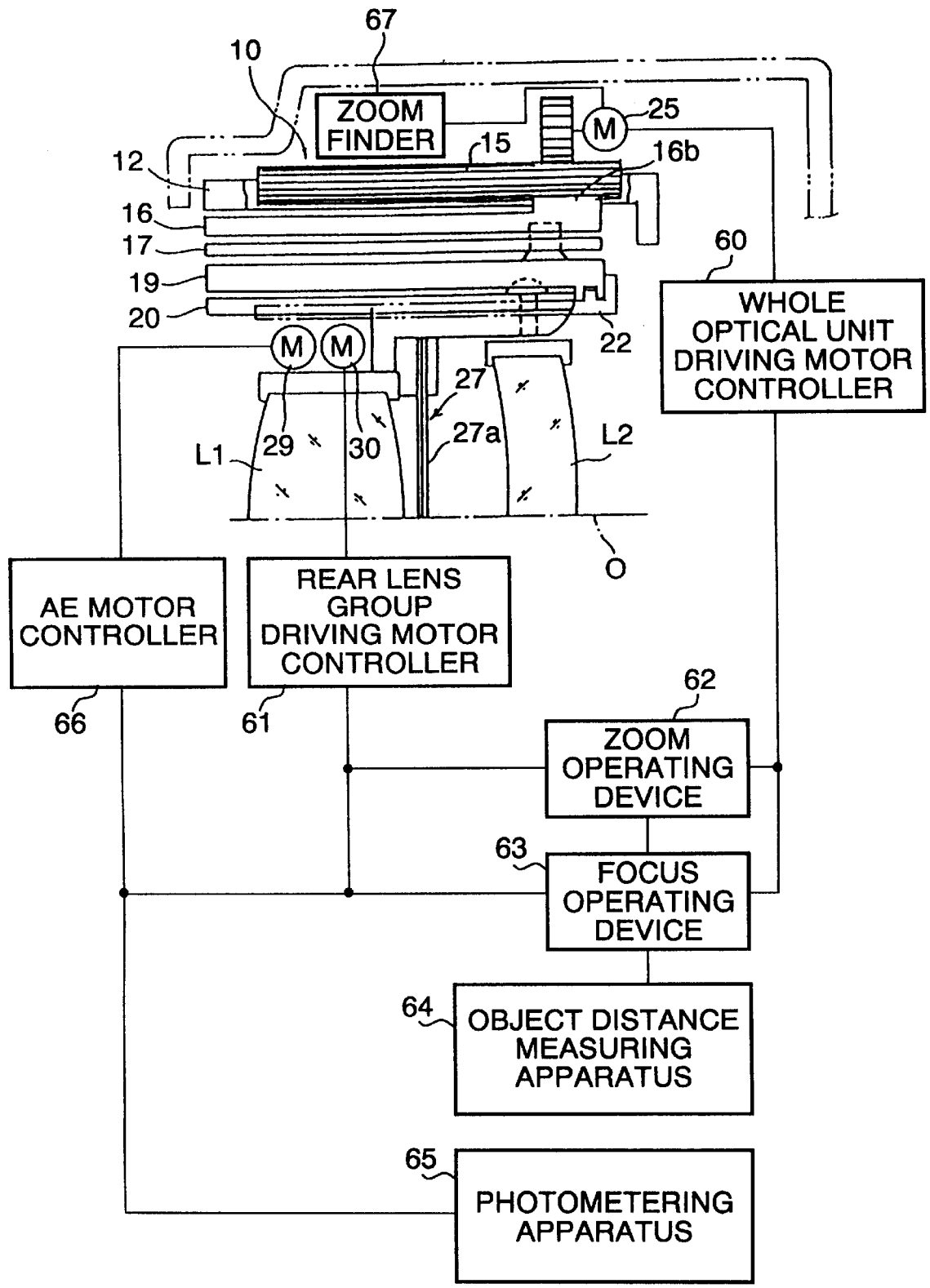
FIG. 11 is a block diagram of a controlling system for controlling an operation of the zoom lens barrel.

The concept of the zoom lens camera will now be described with reference to FIG. 11. FIG. 11 is a schematic representation of various elements which comprise a zoom lens camera.

The zoom lens camera is provided with a three-stage delivery-type zoom lens barrel 10 having three movable barrels, namely a first movable barrel 20, a second movable barrel 19 and a third movable barrel 16, which are concentrically arranged in this order from an optical axis O. In the zoom lens barrel 10, two lens groups are provided, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996 now abandoned, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operative device 62 may comprise as, for example, a manually-operable zoom operating lever (not shown) provided on the camera body or a pair of zoom buttons, e.g., a "wide" zoom button and a "tele" zoom button, (not shown) provided on the camera body. When the zoom operating device 62 is operated, the whole optical unit driving motor controller 60 drives a whole optical unit driving motor 25 to move the front lens group L1 and the rear lens group L2, rearwardly or forwardly. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies sequentially to the variation of the focal length through the operation of the zoom operating device 62. Therefore, the photographer may perceive the variation of the set focal length through the operation of the zoom operating device 62, by observing the variation of image magnification of the visual field of the finder. In addition, the focal length, set by the operation of the zoom operating device 62, may be indicated as a value on an LCD (liquid crystal display) panel (not shown) or the like.

When the focus operating device 63 is operated, the whole optical unit driving motor controller 60 drives the whole optical unit driving motor 25. At the same time the rear lens group driving motor controller 61 drives a rear lens group driving motor 30. The driving of the whole optical unit driving motor controller 60 and the rear lens group driving motor controller 61, moves the front and rear lens groups L1 and L2 to respective positions corresponding to a set focal length and a detected object distance, such that the zoom lens is focused on the object.

Specifically, the focus operating device 63 is provided with a release button (not shown) provided on an upper wall of the camera body. A photometering switch and a release switch (both not shown) are synchronized with the release button. When the release button is half-depressed (half-step), the photometering switch is turned ON, and the object distance measuring and photometering commands are respectively input to the object distance measuring apparatus 64 and the photometering apparatus 65.

When the release button is fully depressed (full step), the release switch is turned ON, and according to the result of object distance measuring command and a set focal length, the whole optical unit driving motor 25 and the rear lens group driving motor 30 are driven. In addition, the focusing operation, in which the front lens group L1 and the rear lens group L2 move to the focusing position, is executed. Further, an AE motor 29 of an AF/AE (i.e., autofocus/autoexposure) shutter unit (FIG. 9) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operating device 62 is operated, the zoom operating device 62 drives the whole optical unit driving motor 25 to move the front and rear lens groups L1 and L2 together as a whole along the optical axis O (optical axis direction). Simultaneous with such a movement, the rear lens group driving motor 30 may also be driven via the rear lens group driving motor controller 61 to move the rear lens group L2 relatively with respect to the first lens group L1. However, this above-described operation is not performed under the conventional concept of zooming, in which the focal length is varied sequentially while maintaining an in-focus condition. When the zoom operating device 62 is operated, the front lens group L1 and the rear lens group L2 move in the optical axis direction, without varying the distance therebetween, by driving only the whole optical unit driving motor 25.

During the zooming operation, an in-focus condition cannot be maintained at all times with respect to an object located at a specific distance. However, this is not a problem in a lens-shutter type camera, since the image of the object is not observed through the photographing optical system, but rather through the finder optical system, that is provided separate from the photographing optical system. Thus, it is sufficient that the in-focus condition is obtained when the shutter is released. Accordingly, when the release button is fully depressed, the focusing operation (focus adjusting operation) is carried out by moving at least one of the whole optical unit driving motor 25 and the rear lens group driving motor 30. In such a manner, when the focus operating device 63 is operated and since each of the two lens groups L1, L2 can be driven independently, the position of the lens groups L1, L2 can be flexibly controlled.

An embodiment of the zoom lens barrel according to the above concept will be described with reference to mainly FIGS. 9 and 10.

The overall structure of the zoom lens barrel 10 will now be described.

The zoom lens barrel 10 is provided with the first movable barrel 20, the second movable barrel 19, the third movable barrel 16, and a fixed lens barrel block 12. The third movable barrel 16 engages a cylindrical portion 12p of the fixed lens barrel block 12, and moves along the optical axis O upon being rotated. A linear guide barrel 17 is provided on an inner periphery of the third movable barrel 16 which is rotationally restricted. The linear guide barrel 17 and the third movable barrel 16 move together as a whole along the optical axis O, with the third movable barrel 16 rotating relative to the linear guide barrel 17. The first movable barrel 20 moves along the optical axis O and is rotationally restricted. The second movable barrel 19 rotatably moves relative to the linear guide barrel 17 and the first movable barrel 20 along the optical axis O. The whole optical unit driving motor 25 is secured to the fixed lens barrel block 12. A shutter mounting stage 40 is secured to the first movable barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

The fixed lens barrel block 12 is fixed in front of an aperture plate 14 fixed to the camera body. The aperture plate 14 is provided on a center thereof with a rectangular-shaped aperture 14a which forms the limits of each exposed frame. The fixed lens barrel block 12 is provided, on an inner periphery of the cylindrical portion 12p thereof, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends substantially along the whole of the length of the fixed lens barrel block 12. The code plate 13a is part of a flexible printed circuit board 13 positioned outside the fixed lens barrel block 12.

Figure 7:
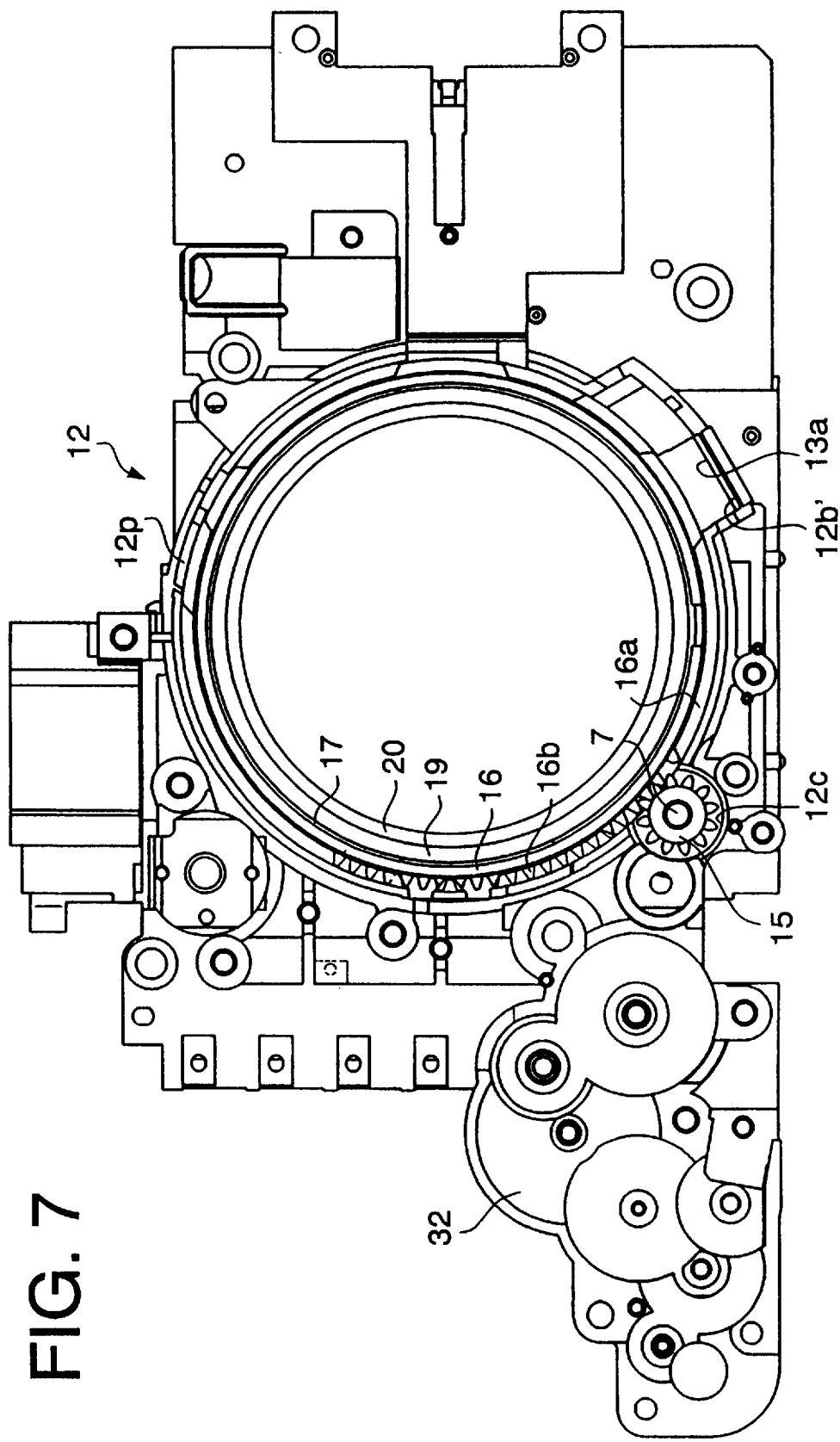
FIG. 7 is a front elevational view of a fixed lens barrel block of the zoom lens barrel.
Figure 10:
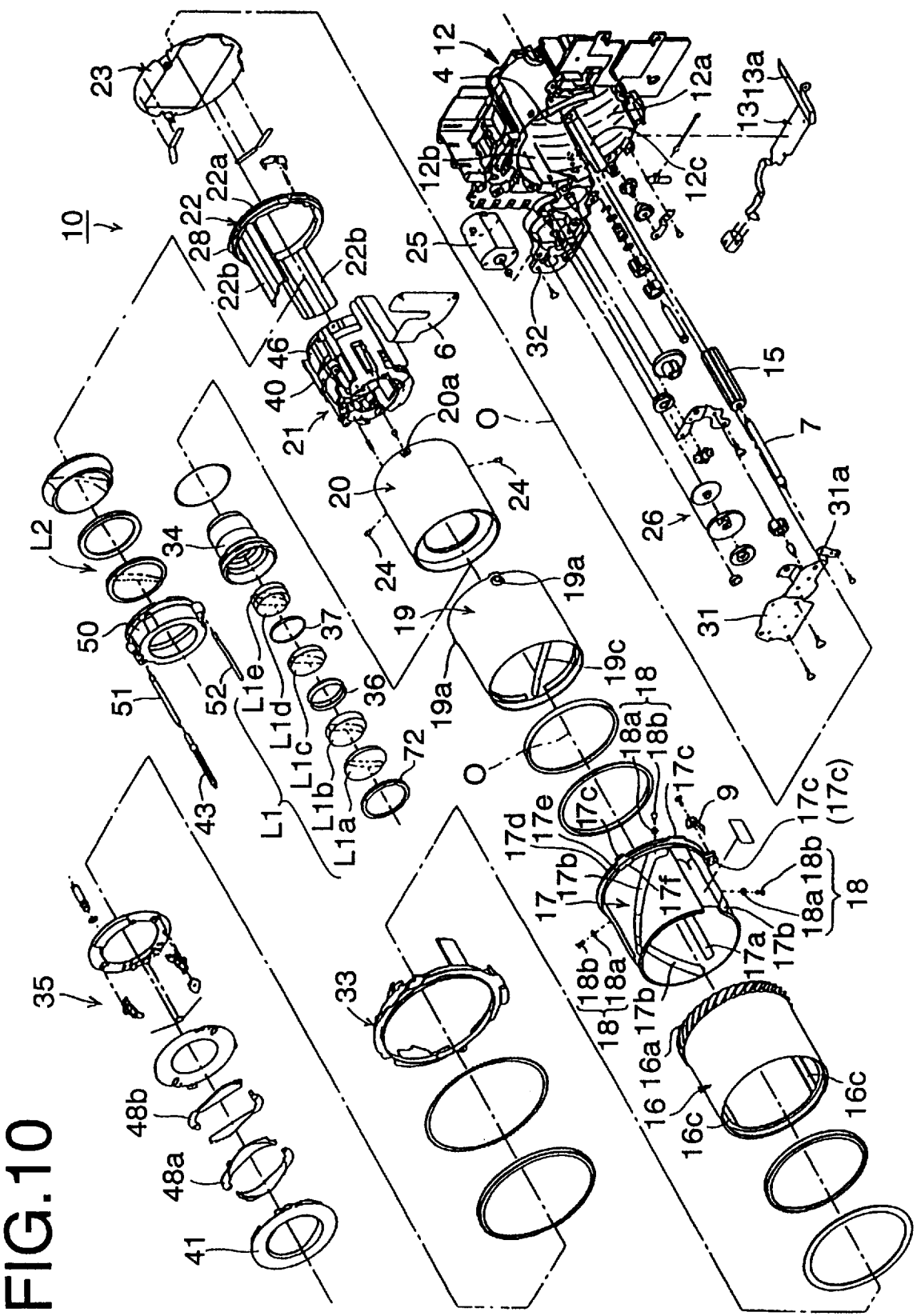
FIG. 10 is an exploded perspective view of the overall structure of the zoom lens barrel.

A gear housing 12c is provided as shown in FIG. 7 or 10 in the fixed lens barrel block 12. The gear housing 12c is recessed outwardly from an inner periphery of the cylindrical portion 12p of the fixed lens barrel block 12 in a radial direction while extending in the optical axis direction. In the gear housing 12c, a driving pinion 15, extending in the optical axis direction, is rotatably positioned. Both ends of an axial shaft 7 of the driving pinion 15 are rotatably supported by a supporting hollow 4, which is provided in the fixed lens barrel block 12, and a supporting hollow 31a, which is provided on a gear supporting plate 31 fixed on the fixed lens barrel block 12 by set screws (not shown), respectively. Part of the teeth of the driving pinion 15 project inwardly from the inner periphery of the cylindrical portion of the fixed lens barrel block 12, so that the driving pinion 15 meshes with an outer peripheral gear 16b of the third movable barrel 16, as shown in FIG. 7.

Figure 6:
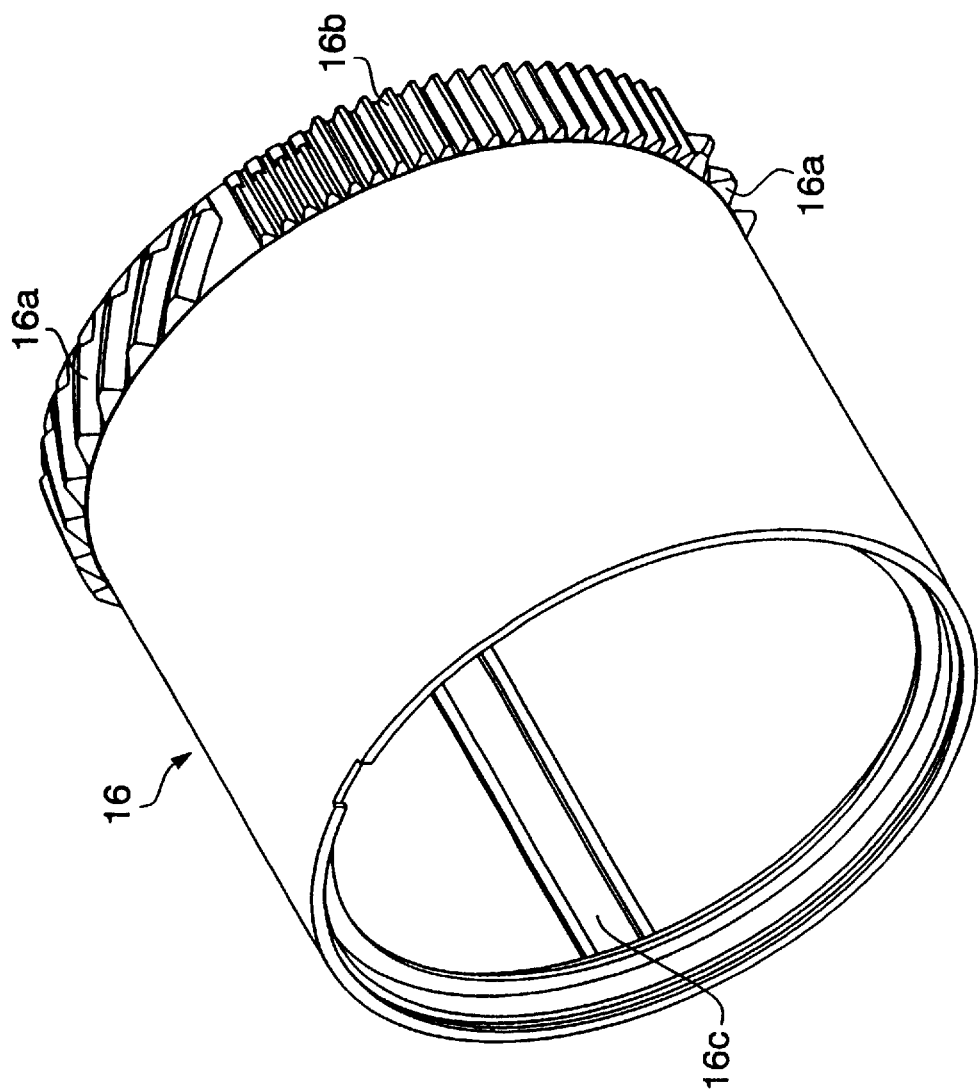
FIG. 6 is an external schematic perspective view of a third movable barrel of the zoom lens barrel.

A plurality of linear guide grooves 16c are formed on an inner periphery of the third movable barrel 16, each of which extends parallel to the optical axis O. At an outer periphery of the rear end of the third movable barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to engage with the outer peripheral gear 16b throughout the entire range of movement of the third movable barrel 16 in the optical axis direction.

As shown in FIG. 10, the linear guide barrel 17 is provided with a rear end flange 17d on a rear part of an outer periphery. The rear end flange 17d has a plurality of engaging projections 17c each projecting away from the optical axis O in a radial direction. The linear guide barrel 17 is further provided with an anti-dropping flange 17e in front of the rear end flange 17d. A circumferential groove 17g is formed between the rear end flange 17d and the anti-dropping flange 17e. The anti-dropping flange 17e has a radius which is smaller than the rear end flange 17d. The anti-dropping flange 17e is provided with a plurality of cutout portions 17f. Each of the cutout portions 17f allows a corresponding engaging projection 16d to be inserted into the circumferential groove 17g, as shown in FIG. 9.

The third movable barrel 16 is provided with a plurality of engaging projections 16d on an inner periphery of the rear end thereof. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 9). By rotating the third movable barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed on the rear end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, in particular projection 17c'. The contacting terminal 9 is in slidable contact with the code plate 13a, fixed to the bottom of the linear guide groove 12b', to generate signals corresponding to focal length information during zooming.

On the inner periphery of the linear guide barrel 17 a plurality of linear guide grooves 17a are formed, each extending parallel to the optical axis O. A plurality of lead slots 17b are also formed on the linear guide barrel 17 as shown in FIG. 10. The lead slots 17b are each formed oblique (inclined) to the optical axis O.

The second movable barrel 19 engages with the inner periphery of the linear guide barrel 17. A plurality of lead grooves 19c are provided on the inner periphery of the second movable barrel 19, in a direction inclined oppositely to the lead slots 17b. A plurality of follower projections 19a are provided On the outer periphery of the rear end of the second movable barrel 19. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third movable barrel 16. With such an arrangement, when the third movable barrel 16 rotates, the second movable barrel 19 rotates while moving linearly in the optical axis direction.

The first movable barrel 20 is engaged to the inner periphery of the second movable barrel 19. A plurality of follower pins 24 are provided on an outer periphery of the rear of the first movable barrel 20, each engaging with the corresponding inner lead groove 19c. In addition, the first movable barrel 20 is guided linearly by a linear guide member 22. The first movable barrel 20 is provided at the front end thereof with a decorative plate 41.

Figure 1:
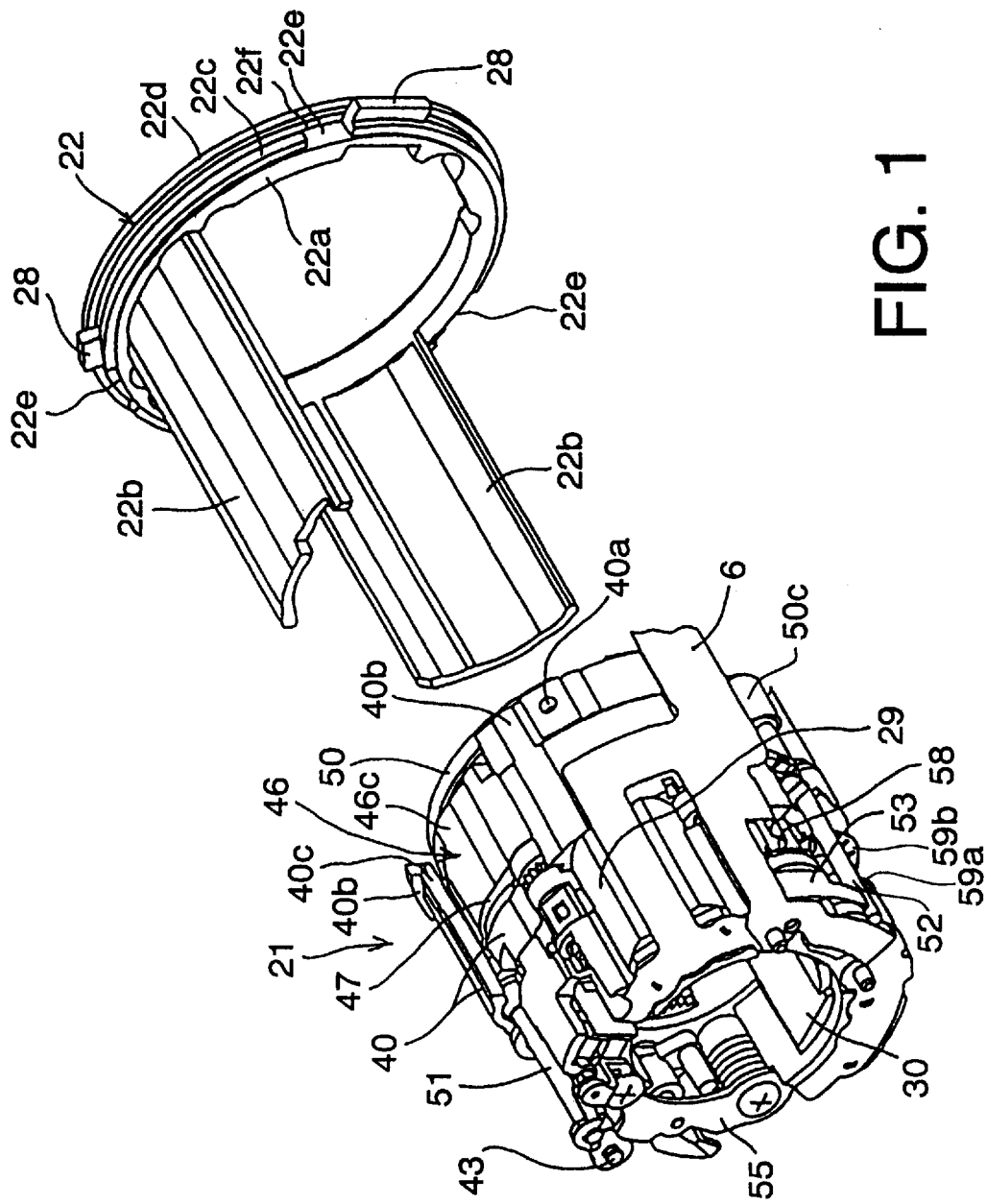
FIG. 1 is an enlarged schematic perspective view showing a part of a zoom lens barrel.
Figure 2:
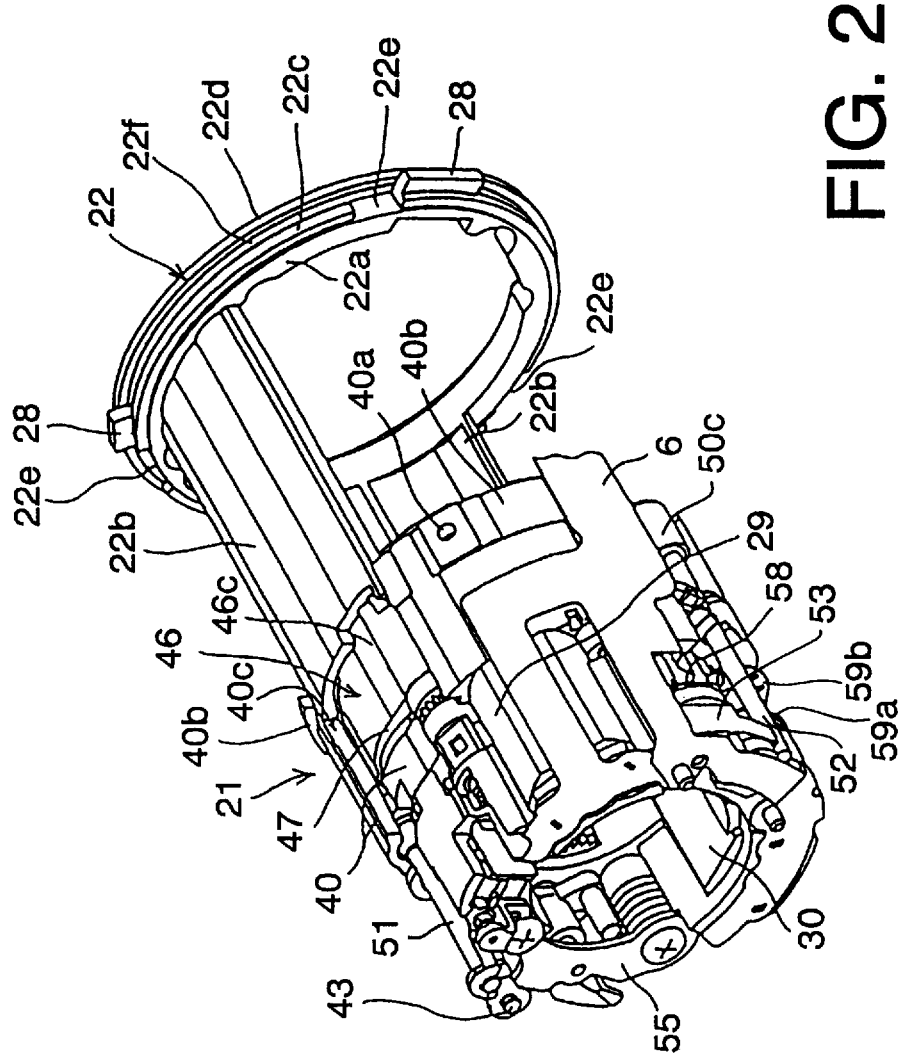
FIG. 2 is a schematic perspective view showing the part of the zoom lens barrel shown in FIG. 1 in an engaged state.
Figure 3:
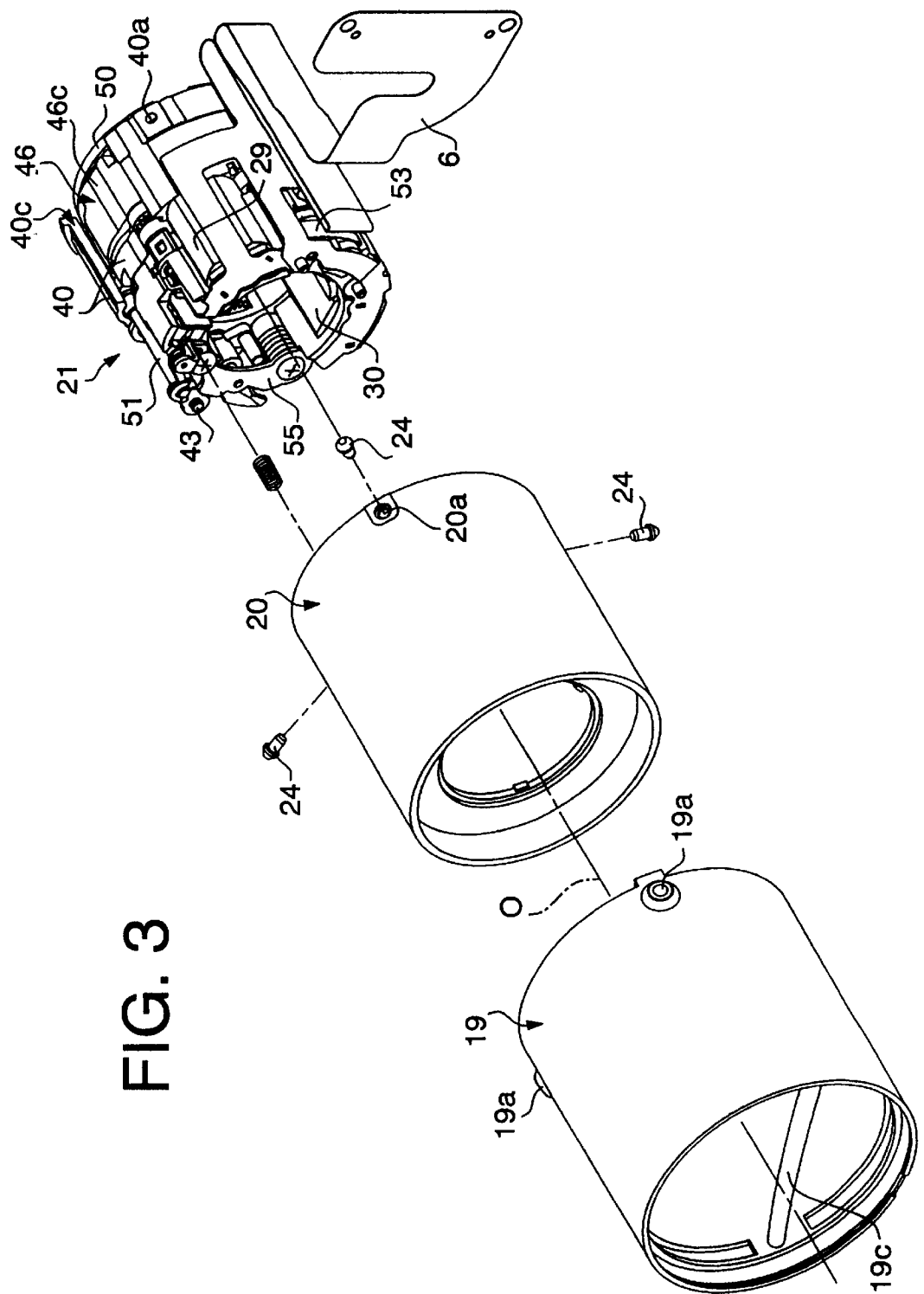
FIG. 3 is an enlarged exploded perspective view showing a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first movable barrel 20 and the AF/AE shutter unit 21.

The annular member 22a of the linear guide member 22 is connected to the rear of the second movable barrel 19, such that the linear guide member 22 and the second movable barrel 19 move along the optical axis O as a whole, and in addition are capable of relatively rotating with respect to each other around the optical axis O. The linear guide member 22 is further provided, on the outer periphery of the rear end thereof, with a rear end flange 22d. The linear guide member 22 is also provided with an anti-dropping flange 22c in front of the rear end flange 22d. A circumferential groove 22f is formed between the rear end flange 22d and the anti-dropping flange 22c. The anti-dropping flange 22c has a radius which is smaller than the rear end flange 22d. As shown in FIG. 1 or 2, the anti-dropping flange 22c is provided with a plurality of cutout portions 22e, each allowing a corresponding engaging projection 19b to be inserted into the circumferential groove 22f (see FIG. 9).

A plurality of engaging projections 19b, each projecting towards the optical axis O in a radial direction are provided on an inner periphery of the rear end of the second movable barrel 19. By inserting the engaging projections 19b into the circumferential groove 22f through the corresponding cutout portions 22e, the engaging projections 19b are positioned in the circumferential groove 22f between the flanges 22c and 22d. By rotating the second movable barrel 19 relative to the linear guide member 22, the engaging projections 19b are engaged with the linear guide member 22. With the above structure, when the second movable barrel 19 rotates in the forward or reverse rotational direction, the first movable barrel 20 moves linearly, forwardly or rearwardly along the optical axis O, but is restricted from rotating.

Figure 8:
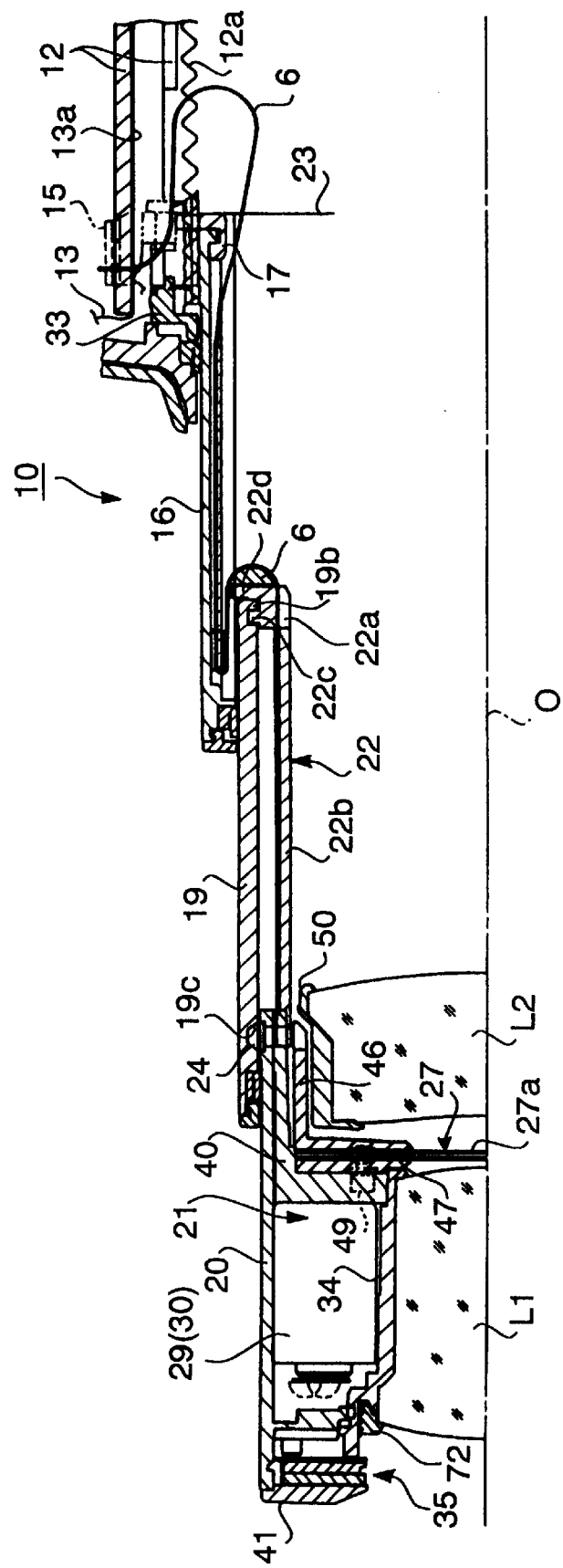
FIG. 8 is a sectional view of an upper part of the zoom lens barrel in a maximum extended state.

A barrier apparatus 35 having barrier blades 48a and 48b is mounted to the front of the first movable barrel 20. On an inner peripheral face of the first movable barrel 20 the AF/AE shutter unit 21 is engaged and fixed, as shown in FIG. 8. The AF/AE shutter unit 21 includes the shutter 27, which consists of three shutter blades 27a The AF/AE shutter unit 21 is provided with a plurality of fixing holes 40a formed at even angular intervals on the outer periphery of the shutter mounting state 40. Only one of the fixing holes 40a appears in each of FIGS. 1–5.

Figure 4:
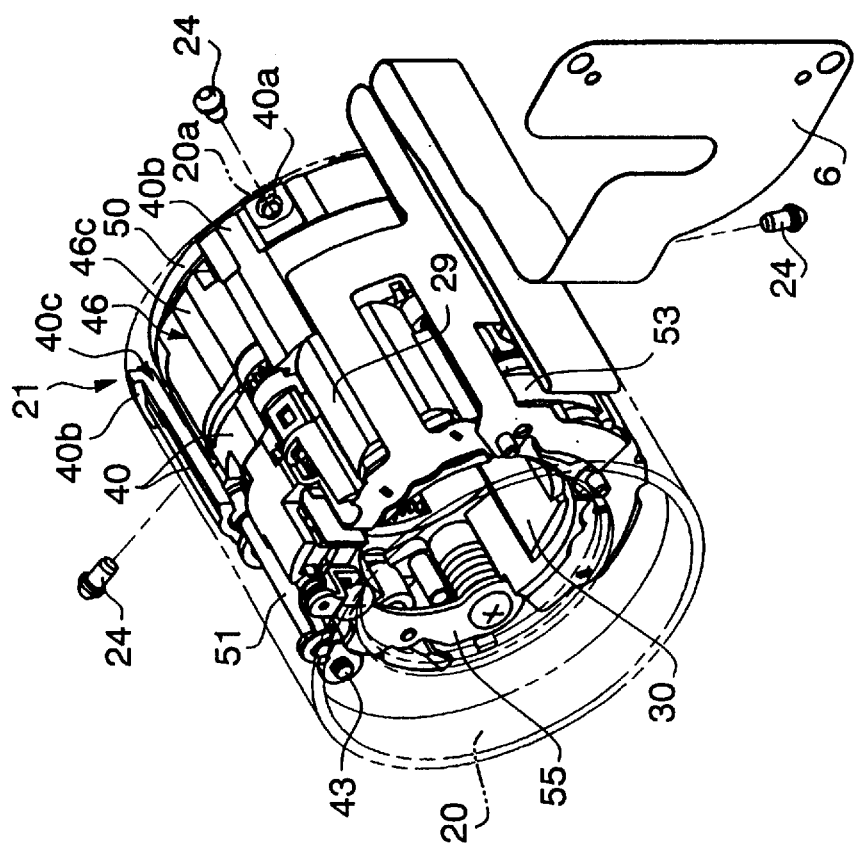
FIG. 4 is a schematic perspective view illustrating a state where an AF/AE shutter unit of the zoom lens barrel is mounted to a first movable barrel.

The aforementioned plurality of follower pins 24, which engage with the inner lead grooves 19c, also serve as device for fixing the AF/AE shutter unit 21 to the first movable barrel 20. The follower pins 24 are inserted and fixed in holes 20a, formed on the first movable barrel 20, and in the fixing holes 40a. With this arrangement the AF/AE shutter unit 21 is secured to the first movable barrel 20 as shown in FIG. 4. In FIG. 4 the first movable barrel 20 is indicated by phantom lines. The follower pins 24 may be fixed by an adhesive, or the pins 24 may comprise as screws which are screwed into the fixing holes 40a.

Figure 5:
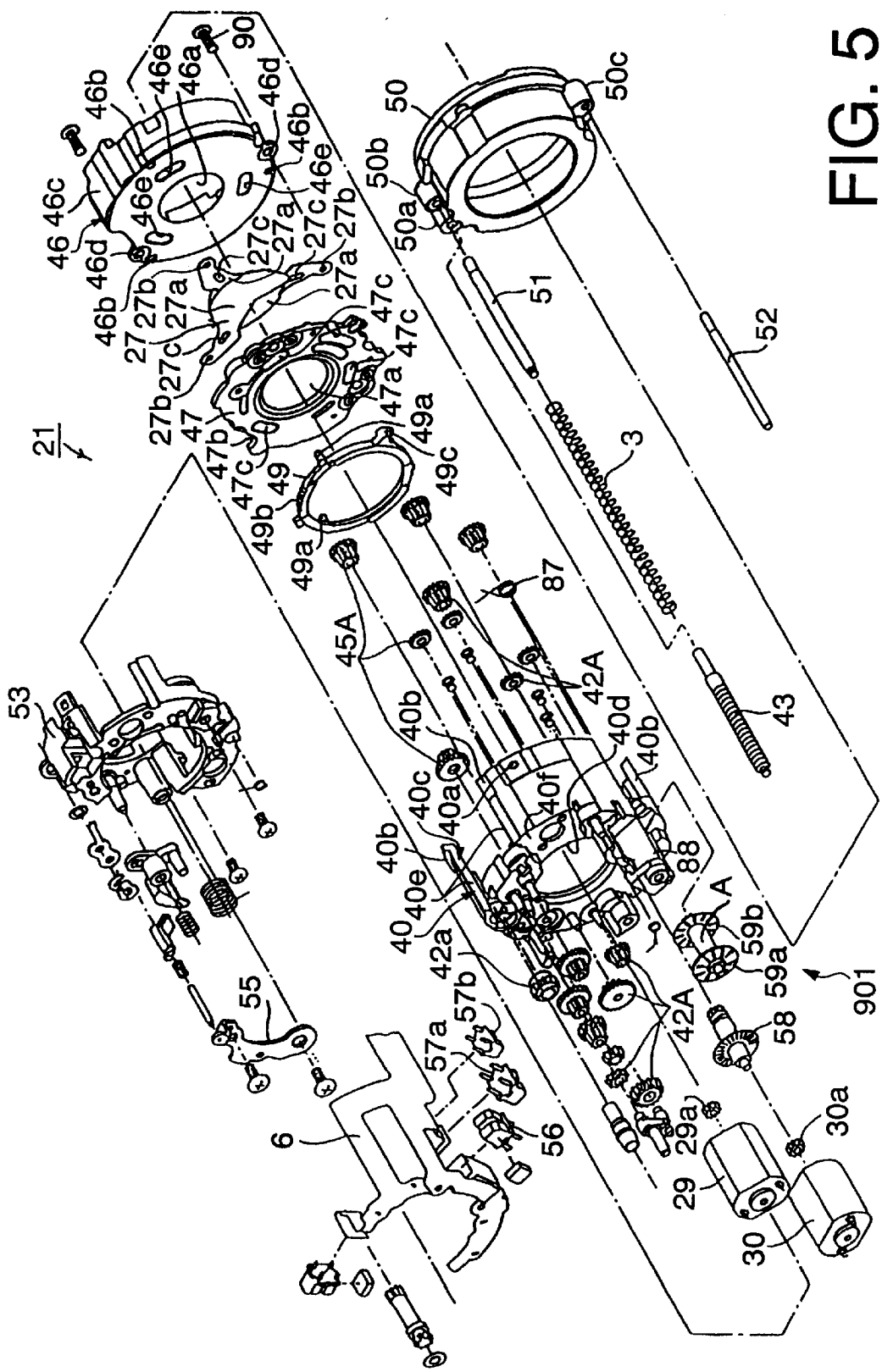
FIG. 5 is an exploded perspective view illustrating main parts of the AF/AE shutter unit of the zoom lens barrel.

As illustrated in FIGS. 5 and 10, the AF/AE shutter unit 21 is provided with the shutter mounting state 40, a shutter blade supporting ring 46 which is fixed on the rear of the shutter mounting stage 40 so as to be located inside the shutter mounting stage 40, and the lens supporting barrel 50 supported such that it is movable relative to the shutter mounting stage 40. The lens supporting barrel 34, the AE motor 29, and the rear lens group driving motor 30, are supported on the shutter mounting stage 40. The shutter mounting stage 40 is provided with an annular member 40 having a circular aperture 40d. The shutter mounting stage 40 is also provided with three legs 40b which project rearwardly with respect to the camera body from the annular member 40f. Three slits are defined between the three legs 40b. Two of the slits comprise the aforementioned linear guides 40c, which slidably engage with the respective pair of guide legs 22b of the linear guide member 22, so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photo-interrupters 56, 57a and 57b which are connected to a flexible printed circuit board 6, and rotating disks 58, 59a and 59b, having a plurality of radially formed slits provided in the circumferential direction. An encoder for detecting whether the rear lens group driving motor 30 is rotating and for detecting an amount of rotation of the rear lens group driving motor 30 consists of the photo-interrupters 57a, 57b and the rotating disks 59a, 59b. An AE motor encoder for detecting whether the AE motor 29 is rotating and for detecting an amount of rotation of the AE motor 29 consists of the photo-interrupter 56 and the rotating disk 58.

The shutter 27, a supporting member 47 which pivotally supports the three shutter blades 27a of the shutter 27, and a circular driving member 49, which provides rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the shutter blade supporting ring 46 is provided, at a front end thereof, with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 10) at respective positions opposite the three supporting holes 46b. Each shutter blade 27a is provided at one end thereof with a hole 27b into which the corresponding pivotal shaft 47b is inserted, such that each shutter blade 27a is rotatable about the corresponding pivotal shaft 47b. The major part of each shutter blade 27a, that extends normal to the optical axis O from the pivoted end, is formed as a light-interceptive portion. All three light-interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the is light-interceptive portion thereof, with a slot 27c, through which the corresponding operating projection 49a is inserted. The supporting member 47 is fixed to the shutter blade supporting ring 46 in such a manner that, each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation force from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46d provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof, and is restricted to move in the axial direction. The screw shaft 43, one end of which is fixed to the lens supporting barrel 50, engages with the female thread hole of the driving gear 42a. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws (not shown). The motors 29, 30 and the photo-interrupters 56, 57a and 57b are connected to the flexible printed circuit board 6. One end of the flexible printed circuit board 6 is fixed to the shutter mounting stage 40.

After the first, second and third movable barrels 20, 19 and 16, and the AF/AE shutter unit 21, etc. are assembled, the aperture plate 23 is fixed to the rear of the linear guide barrel 17, and a supporting member 33 having a circular shape is fixed at the front of the fixed lens barrel block 12.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L2 is supported on the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be constructed in such a manner that the rear lens group L2 is not supported by the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by any supporting member other than the AF/AE shutter unit 21.

The operation of the zoom lens barrel 10, by rotation of the whole optical unit driving motor 25 and the rear lens group driving motor 30, will now be described with reference to FIGS. 8 and 9.

Figure 9:
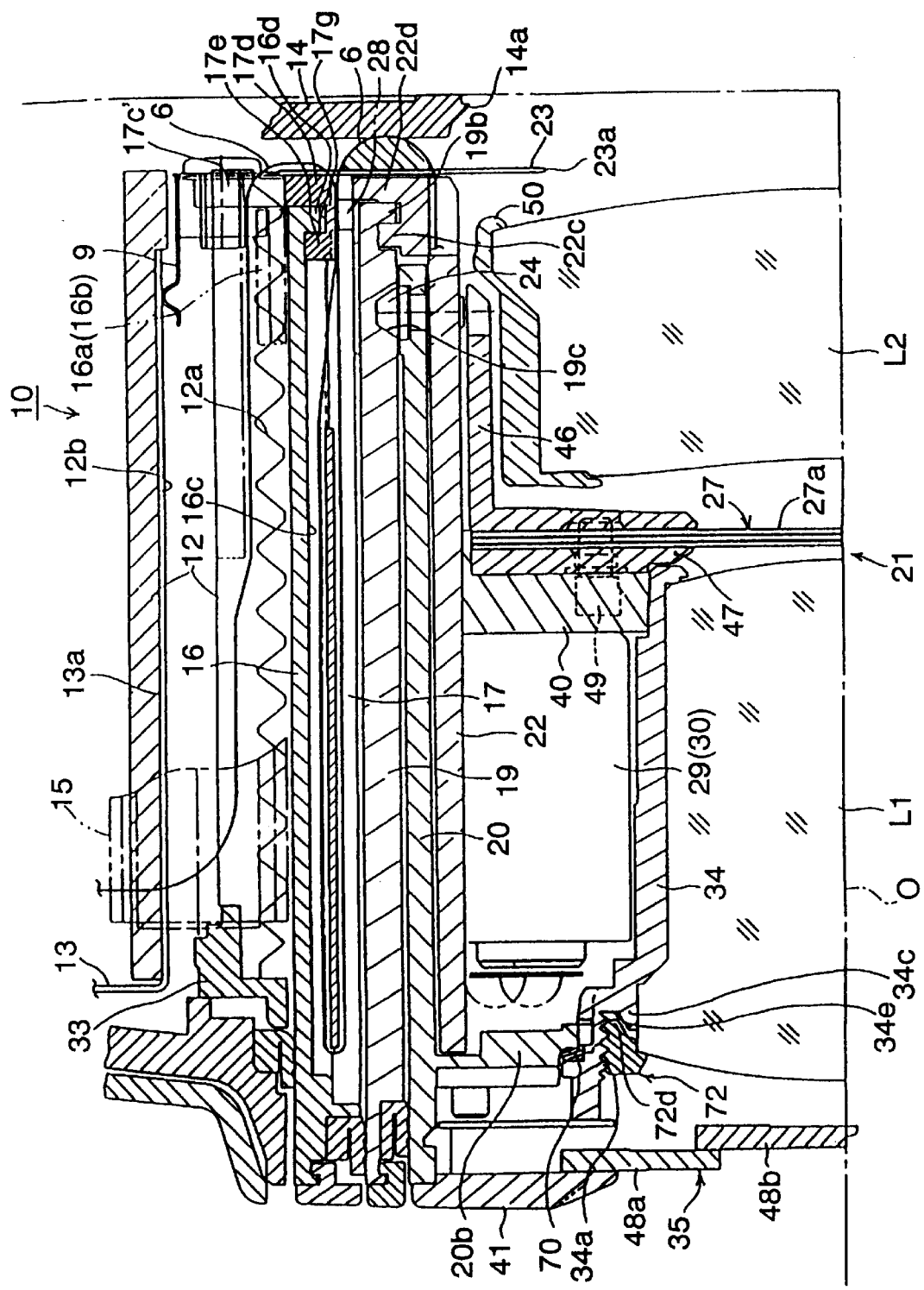
FIG. 9 is a sectional view of an upper part of the zoom lens barrel in a housed state.

As shown in FIG. 9, when the zoom lens barrel 10 is at the most retracted (withdrawn) position, i.e., the lens-housed condition. When the power switch is turned ON, the drive shaft of the whole optical unit driving motor 25 is driven to rotate in the forward rotational direction by a small amount. This rotation of the motor 25 is transmitted to the driving pinion 15 through a gear train 26, which is supported by a supporting member 32 integrally formed with the fixed lens barrel block 12, to rotate the third movable barrel 16 in one predetermined rotational direction to advance forwardly along the optical axis O. Therefore, the second movable barrel 19 and the first movable barrel 20 are each advanced by a small amount in the optical axis direction, along with the third movable barrel 16. Consequently, the camera is placed in a state capable of photographing, with the zoom lens positioned at the widest position, i.e., the wide end. In this state, the focal length may be detected in accordance with the amount of relative movement between the sliding movement of the code plate 13a and the contacting terminal 9 as the linear guide barrel 17 moves with respect to the fixed lens barrel block 12.

In the photographable state as above described, when the aforementioned zoom operating lever is manually moved towards a "tele" side, or the "tele" zoom button is manually depressed to be turned ON, the whole optical unit driving motor 25 is driven to rotate in the forward rotational direction through the whole optical unit driving motor controller 60. The rotation of the optical unit driving motor 25 causes the third movable barrel 16 to rotate in the rotational direction to advance along the optical axis O via the driving pinion 15 and the outer peripheral gear 16b. Therefore, the third movable barrel 16 is advanced from the fixed lens barrel block 12, according to the relationship between the female helicoid 12a and the male helicoid 16a. At the same time, the linear guide barrel 17 moves forwardly along the optical axis O together with the third movable barrel 16, without relatively rotating with respect to the fixed lens barrel block 12, and in accordance with the relationship between the engaging projections 17c and the linear guide grooves 12b. At this time, the simultaneous engagement of the follower pins 18 with the respective lead slots 17b and the linear guide grooves 16c causes the second movable barrel 19 to move forwardly relative to the third movable barrel 16 in the optical axis direction. In addition, the second movable barrel 10 rotates together with the third movable barrel 16 in the same rotational direction relative to the fixed lens barrel block 12. The first movable barrel 20 moves forwardly from the second movable barrel 19 along the optical axis O together with the AF/AE shutter unit 21, without relatively rotating with respect to the fixed lens barrel block 12 due to the above-noted structures in which the first movable barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length is detected.

Conversely, when the zoom operating lever is manually moved towards a "wide" side, or the "wide" zoom button is manually depressed to be turned ON, the whole optical unit driving motor 25 is driven to rotate in the reverse rotational direction by the whole optical unit driving motor controller 60, so that the third movable barrel 16 rotates in the rotational direction to retract into the fixed lens barrel block 12 together with the linear guide barrel 17. At the same time, the second movable barrel 19 is retracted into the third movable barrel 16 while rotating in the same direction as that of the third movable barrel 16, and the first movable barrel 20 is retracted into the rotating second movable barrel 19 together with the AF/AE shutter unit 21. During the above retraction driving, similar to the case of advancing driving as above described, the rear lens group driving motor 30 is not driven.

While the zoom lens barrel 10 is driven during the zooming operation, the front lens group L1 and the rear lens group L2 move as a whole, since the rear lens group driving motor 30 is not driven, which maintains a constant distance between the lens groups, as shown in FIG. 8. The focal length is input via the zoom code plate 13a and the contacting terminal 9 is indicated on an LCD panel (not shown) provided on the camera body.

At any focal length, when the release button is depressed by a half-step, the object distance measuring apparatus 64 is actuated to measure an object distance. At the same time, the photometering apparatus 65 is actuated to measure an object brightness. Thereafter, when the release button is fully depressed, the whole optical unit driving motor 25 and the rear lens group driving motor 30 are each driven by respective amounts each corresponding to the focal length information set in advance and the object distance information obtained from the object distance measuring apparatus 64, so that the front and rear lens groups L1 and L2 are respectively moved to specified positions to obtain a specified focal length and also to bring the object into focus. Immediately after the object is brought into focus, via the AE motor controller 66, the AE motor 29 is driven to rotate the circular driving member 49 by an amount corresponding to the object brightness information obtained from the photometering apparatus 65, so that the shutter 27 is driven to open the shutter blades 27a by a predetermined amount which satisfies the required exposure. Immediately after the three shutter blades 27a are opened and subsequently closed, the whole optical unit driving motor 25 and the rear lens group driving motor 30 are both driven to move the front lens group L1 and the rear lens group L2 to respective initial positions at which they were at prior to a shutter release.

In the following, the rear group moving motor encoder 90 for detecting the amount and direction of rotation of the rear lens group driving motor 30 will now be described in greater detail with reference to FIGS. 1, 5 and 12–15.

The rear group moving motor encoder 90 includes a front rotating disk 59a, a corresponding front photointerrupter 57a, a rear rotating disk 59b, a corresponding rear photointerrupter 57b (where the terms "front" and "rear" are defined according to the standard interpretation of the front and rear of a camera), and a rotating shaft A. The rotating shaft A is rotated in accordance with the rotation of the rear lens group moving motor 30 through the transmission gear train.

The front rotating disk 59a and the rear rotating disk 59b are fixed to the rotating shaft A. Each of the front rotating disk 59a and the rear rotating disk 59b are formed with slits (light transmitting parts) S, at a predetermined angular interval. For example, the center of each slit S is offset from adjacent slits S by an angle of 18°. The number and angular interval of the slits S are identical for both of the front and rear rotating disks.

In this embodiment, since the light modulating patterns are formed as a plurality of slits S on the opaque surfaces of the rotating disks 59a and 59b, the photointerrupters 57a and 57b are used as photocouplers to detect the transmitted light through the slits S.

Each of the front and rear photointerrupters 57a and 57b includes a light emitting element and light receiving element which face each other with a slot d therebetween. The front rotating disk 59a and the rear rotating disk 59b are respectively inserted in the respective slots d of the front and rear photointerrupter 57a and 57b. The light receiving element of the photointerrupter detects the light emitted from the light emitting element and transmitted through the slit S. As the rotating disk rotates, the light receiving element outputs the pulse signal.

Terminals t of the photointerrupters 57a and 57b are connected to the flexible printed circuit board 6 as shown in FIG. 5. These terminals are used to input driving current to the light emitting element and to detect output signal from the light receiving element.

Figure 12:
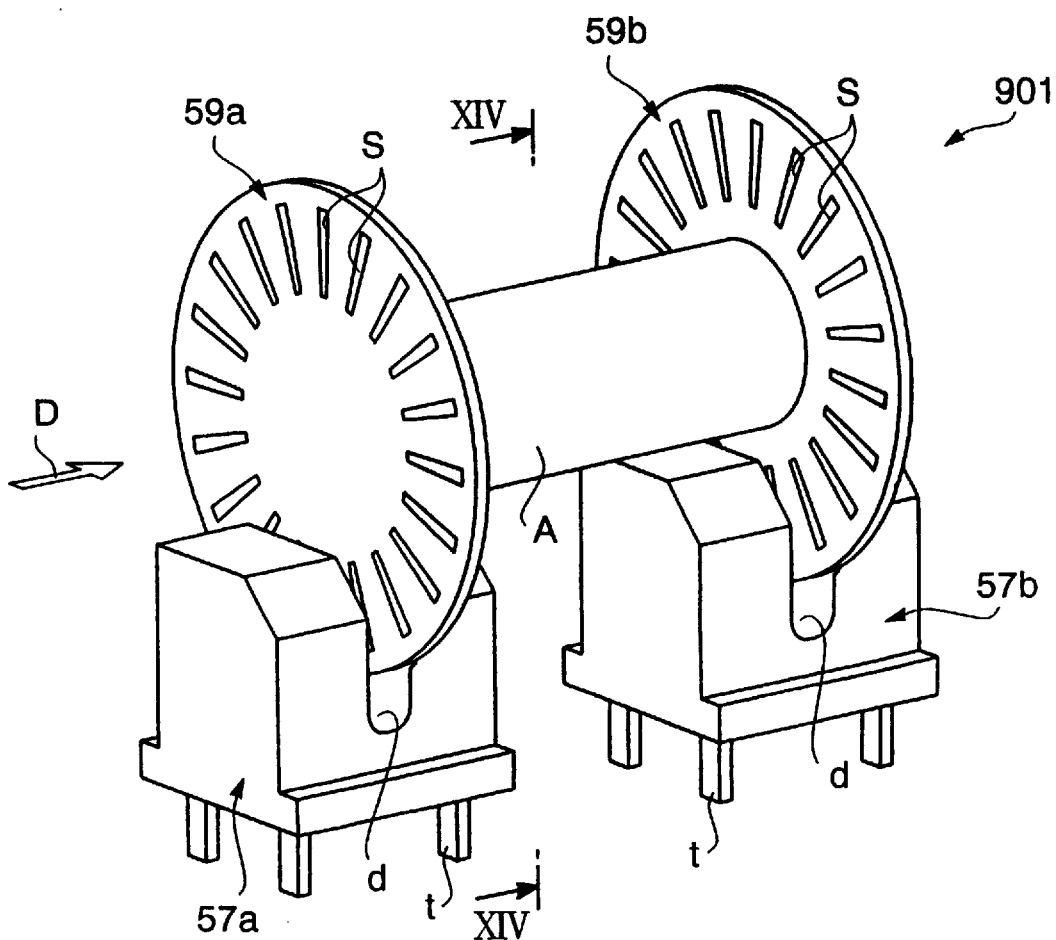
FIG. 12 is a perspective view of an encoder.

As shown in FIG. 12, the front and rear photointerrupters 57a and 57b are aligned along a straight line that is parallel to the rotation axis of the rotating shaft A. That is, the photointerrupters 57a and 57b are mounted on a same flat seating surface 88 as shown in FIG. 5.

Figure 13:
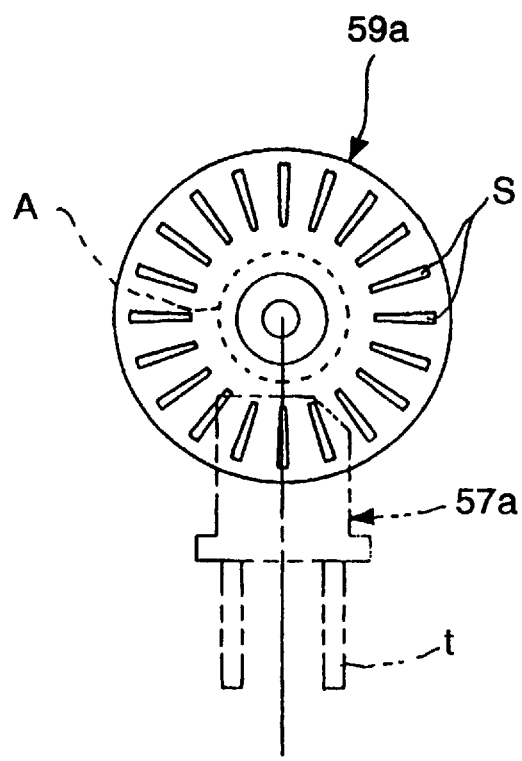
FIG. 13 shows a front view of the encoder.
Figure 14:
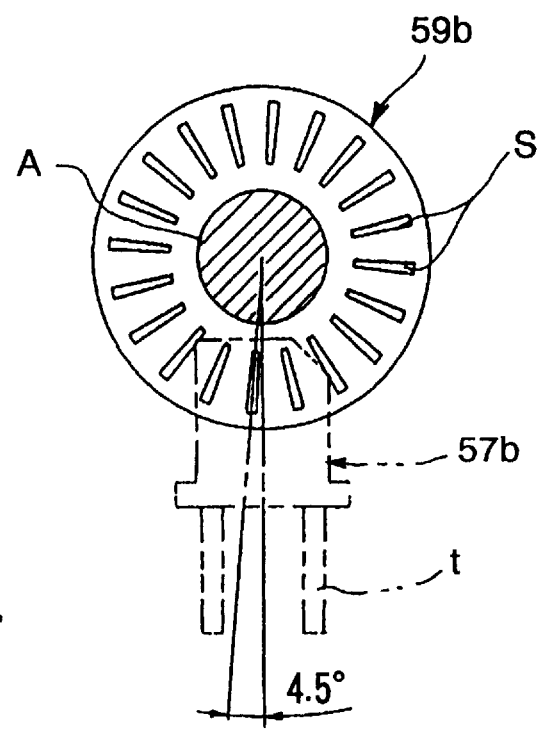
FIG. 14 is a sectional front view of the encoder taken along the section line XIV—XIV in FIG. 12.
Figure 15:
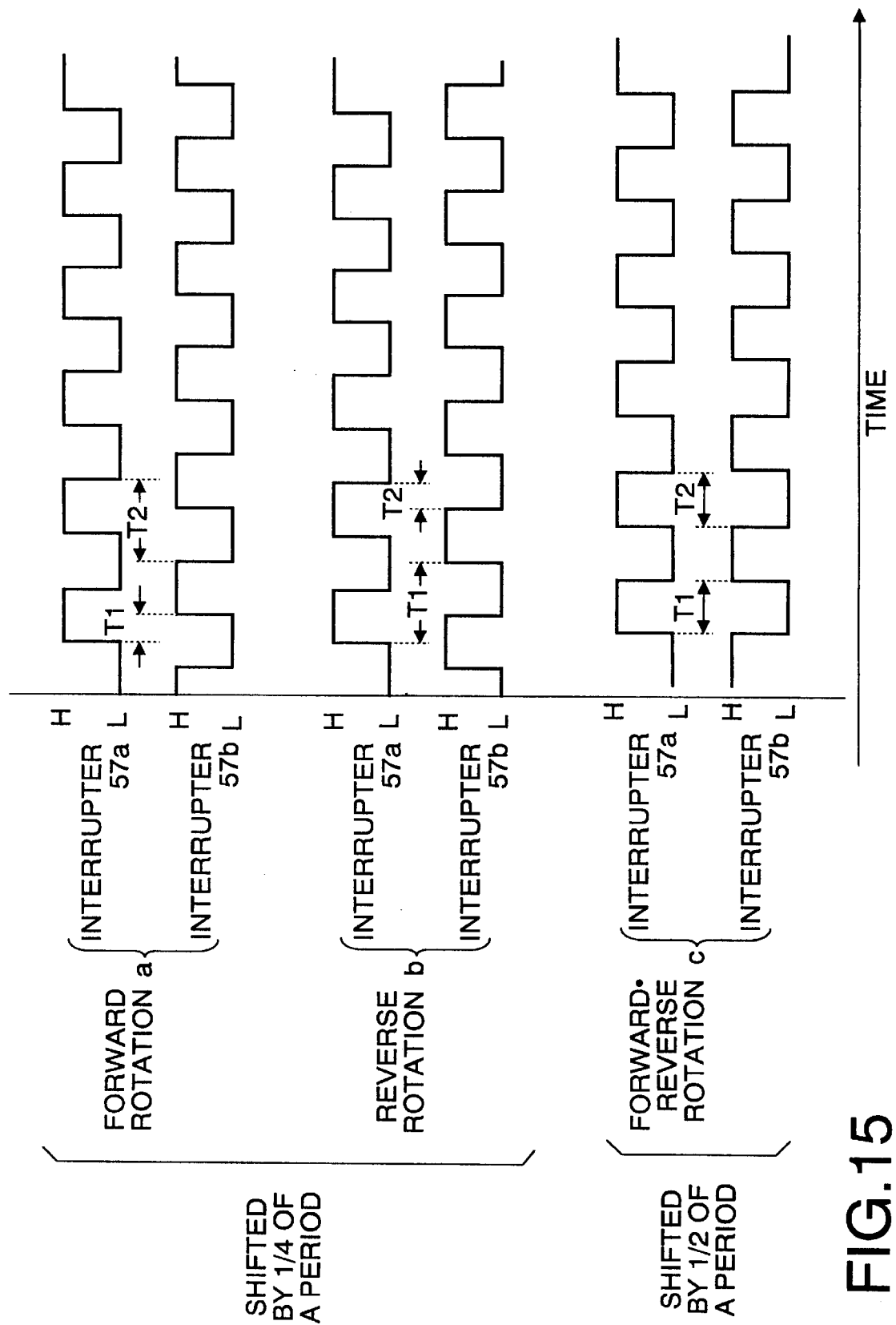
FIG. 15 is a timing chart showing the output of photointerrupters.

The angular relationship between the rotating disks 59a and 59b is selected such that the output signals from the photointerrupters 57a and 57b due to the rotation of the rotating shaft A have a predetermined phase difference that is not equal to a half phase. In this embodiment, the angle of the slits of the rear rotating disk 59b is different from that of the front rotating disk 59a by 4.5° as shown in FIGS. 13 and 14. Since the angular pitch of the slits is equal to 18°, the phase difference is equal to a quarter phase (n/4).

With an arrangement as described above, as the rotating disks 59a and 59b rotate, light projected from the light emitting part to the light receiving part of each of the photointerrupters 57a and 57b is intermittently blocked by the rotation of rotating disks 59a and 59b. Thus, the front photointerrupter 57a and the rear photointerrupter 57b output pulse signals as shown in FIGS. 15a and 15b. When the rear lens group driving motor 30 rotates forward, pulse signals as shown in FIG. 15a are output. When the rear lens group driving motor 30 rotates in reverse, the pulse signals shown in FIG. 15b are output.

The rotation speed is determined by analyzing the cycle or phase of the pulses, as described later. The direction of the rotation is determined by comparing the interval T1 from the rising edge of the pulse signal of the front photointerrupter 57a to the rising edge of the pulse signal of the rear photointerrupter 57b with the interval T2 from the falling edge of the pulse signal of the rear photointerrupter 57b to the falling edge of the pulse signal of the front photointerrupter 57a. When the interval T1 is shorter than the interval T2, it is determined that the rotating shaft A is rotating in the forward direction. Otherwise, when the interval T1 is longer than the interval T2, it is determined that the rotating shaft A is rotating in the reverse direction.

If the rotating disks 59a and 59b are set such that the phase difference of the output signals are equal to half phase as shown in FIG. 15c, the interval T1 is always equal to the interval T2 during rotation at a constant speed, and therefore, the direction of the rotation cannot be determined.

The pulse signals output during the forward/reverse rotation are sent via the flexible printed circuit board 6 to the rear lens group driving motor controller 61 at the control unit (not shown) mounted on the camera body. The control unit includes, for example, a CPU, the AE motor controller 66, the whole optical unit driving motor controller 60, the rear lens group driving motor controller 61, the object distance measuring apparatus 64, and the photometering apparatus 65. Further, the control unit is also connected to, for example, the zooming operating device 62 and the focus operating device 63.

In the rear lens group driving motor controller 61, the amount, speed and direction of movement of the rear lens group driving motor 30 are determined based on the pulse signals output by the photointerrupters 57a and 57b in order to accurately control the movement of the rear lens group L2 in the optical axis direction.

Thus, with the present rear group moving motor encoder 90, since the photointerrupters 57a and 57b are mounted on the same seating face 88 (FIG. 5) provided on shutter mount 40, it becomes easier to form the seating surface than in the prior art where the two seating surfaces must be formed at a predetermined angular difference. Also, since the photointerrupters 57a and 57b are arranged in a straight line, the design of the flexible printed circuit board 6 is simplified. Furthermore, in terms of design, there is no need to change the mounting of photointerrupters 57a and 57b when setting the number and width of the slits on the rotating disks 59a and 59b, changes are made only to the rotating disks 59a and 59b. Since the rotating disks 59a and 59b and the rotating shaft A may be formed integrally from a synthetic resin material, it is easy to change the angular difference of the slits on the two rotating disks by changing the angle between molds for the rotating disks.

Thus, a rear group moving motor encoder 90 is provided which is simple in arrangement, which can accurately detect the amount, speed and direction of rotation of the rear lens group driving motor 30, and which can be readily adjusted.

Figure 16:
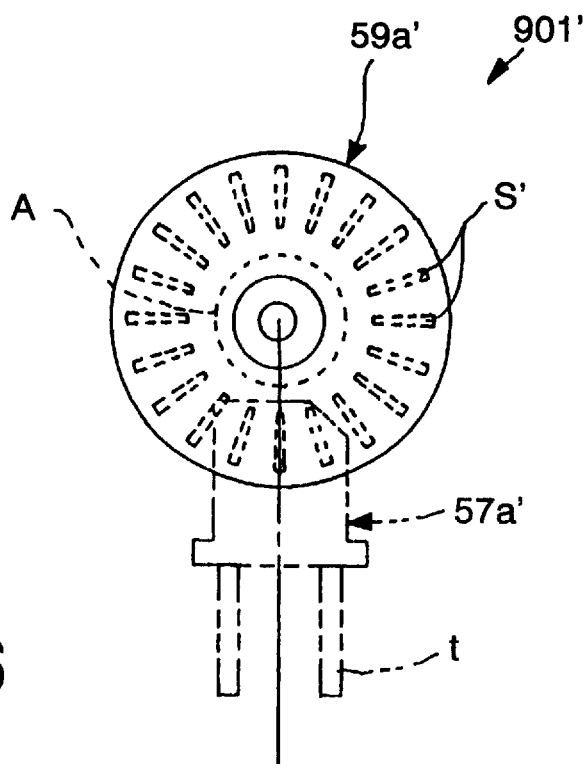
FIG. 16 shows an alternative arrangement of the rotating disk and the photointerrupter.
Figure 17:
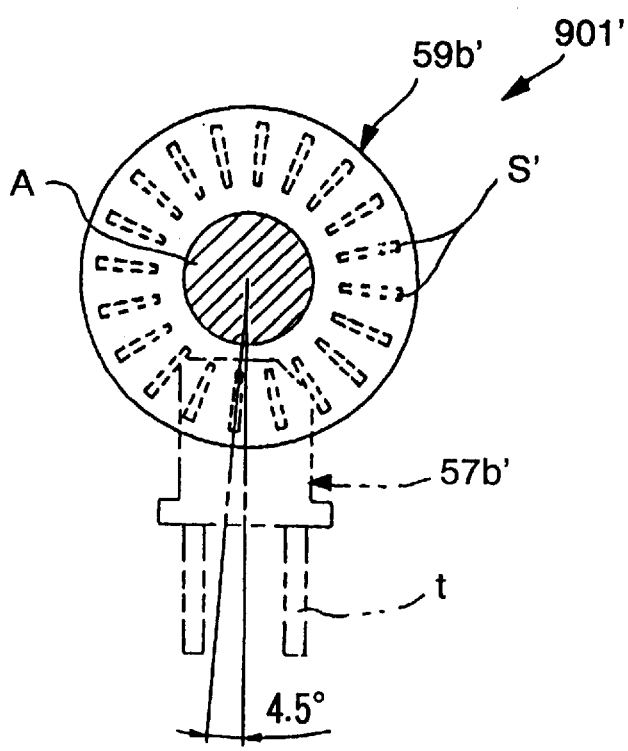
FIG. 17 shows the alternative arrangement of the rotating disk and the photointerrupter in a different condition from that shown in FIG. 16.
Figure 18:
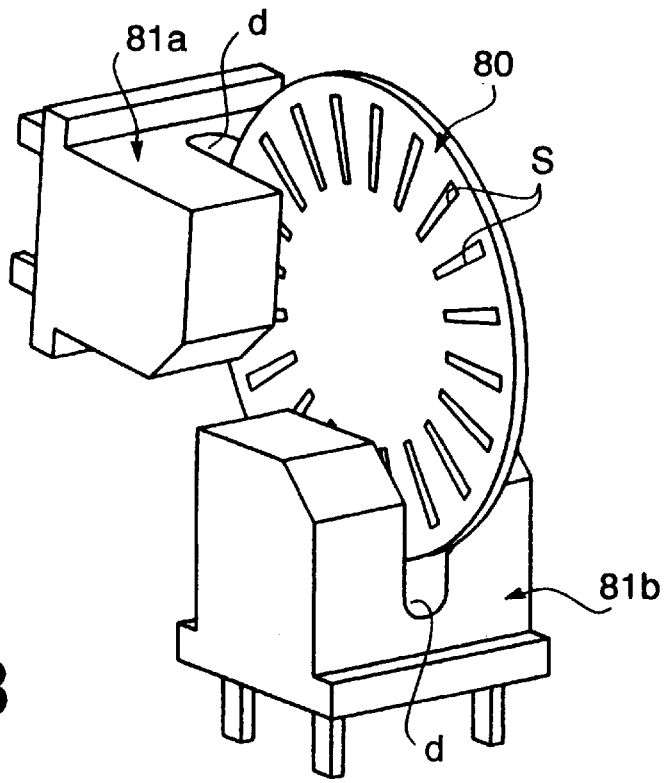
FIG. 18 is a perspective view of a rotating disk and two photointerrupters of a conventional encoder.
Figure 19:
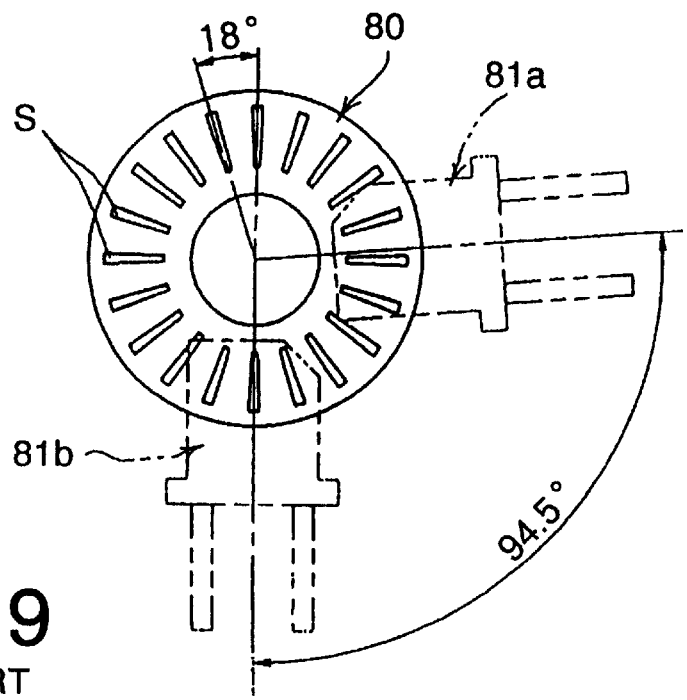
FIG. 19 is a front view of the rotating disk and the photointerrupter of the conventional encoder shown in FIG. 18.

An alternative arrangement of the encoder 90 is shown in FIGS. 16 and 17. In this arrangement, the light modulating pattern is formed as a plurality of light reflecting parts S' arranged at constant angular intervals on the low reflectivity surface of the rotating disks 59a' and 59b'. In this case, photoreflecters 57a' and 57b' are used instead of the photointerrupters to detect the reflected light from the light reflecting parts S'. Each of the photoreflecters 57a' and 57b' is provided with a light emitting element and a light receiving element that are arranged at the same side of the rotating disk so that the light emitted by the light emitting element and reflected from the rotating disk can be detected by the light receiving element.

The output signals from the photoreflecters 57a' and 57b' are similar to that of the photointerrupters shown in FIGS. 15a and 15b. In addition, the angular difference of the rotating disks and the arrangement of the photoreflecters (i.e., arranged along a straight line) are identical to the previously discussed embodiment.

The present disclosure relates to subject matter contained in Japanese Patent Application Nos. HEI 08-059828, filed on Mar. 15, 1996, and HEI 08-012317, filed on Jan. 26, 1996, which are expressly incorporated herein by reference in their entirety.

What is claimed is:

1. An encoder adapted to detect forward/reverse movement of a moving subject, said encoder comprising:

a rotating shaft that is supported on a base and rotates in accordance with the movement of said moving subject;

two rotating disks fixed to said rotating shaft, each of said rotating disks being formed with a predetermined light modulating pattern, a predetermined phase difference being provided between said predetermined light modulating patterns of said rotating disks; and two photocouplers mounted on said base which are associated with said disks to detect said patterns, said photocouplers being phase-aligned with respect to rotation of said disks, wherein the phase difference between said predetermined light modulating patterns of said rotating disks is selected so that the output signals from said photocouplers due to the rotation of said rotating shaft have a predetermined phase difference.

2. The encoder according to claim 1, wherein said rotating disks are provided with the same light modulating patterns.

3. The encoder according to claim 1, wherein said light modulating pattern is formed as a plurality of light transmitting parts arranged at constant angular intervals on the opaque surface of said rotating disk, and wherein each of said photocouplers comprises a photointerrupter to detect the transmitted light through said light transmitting parts.

4. The encoder according to claim 3, wherein said light transmitting parts are formed as a plurality of radial slits.

5. The encoder according to claim 4, wherein said slits are formed such that said photointerrupters generate pulse signals in accordance with the rotation of said rotating shaft.

6. The encoder according to claim 1, wherein said photocouplers are mounted on a flat seating surface that is parallel to said rotating shaft.

7. The encoder according to claim 1, wherein said phase difference between said rotating disks is selected so that the output signals from said photocouplers have a phase difference of a quarter phase.

8. The encoder according to claim 1, wherein said light modulating pattern is formed as a plurality of light reflecting parts arranged at constant angular intervals on the low reflectivity surface of said rotating disk, and wherein each of said photocouplers comprises a photoreflecter to detect the reflected light from said light reflecting parts.

9. The encoder according to claim 1, said two photocouplers being aligned along a line parallel to a longitudinal axis of said shaft.

10. The encoder according to claim 1, said phase difference between said predetermined light modulating patterns of said rotating disks being different than a half pitch of said predetermined light modulating patterns.

11. An encoder adapted to detect a direction of movement of an object, said encoder comprising:

a rotating shaft that rotates in accordance with movement of the object;

two rotating disks fixed to said shaft for rotation without relative movement between said disks and said shaft, each of said disks being formed with a predetermined light modulating pattern, each predetermined light modulating pattern being fixed to one of said rotating disks so that a predetermined phase difference is provided between said predetermined light modulating patterns of each of said rotating disks; and two photocouplers mounted to detect said predetermined light modulating patterns, said photocouplers being phase aligned with respect to rotation of said rotating disks;

wherein the phase difference between said predetermined light modulating patterns of said rotating disks is selected so that signals output from said photocouplers due to rotation of said rotating shaft have a predetermined phase difference.

12. The encoder according to claim 11, wherein said predetermined light modulating patterns on each of said rotating disks are identical, but are positioned so as to provide said predetermined phase difference between said patterns.

13. The encoder according to claim 11, wherein each of said predetermined light modulating patterns is formed as a plurality of light transmitting portions arranged at constant angular intervals on an opaque surface of each of said rotating disks, and wherein each of said photocouplers comprises a photointerrupter to detect light transmitted through said light transmitting portions of each of said rotating disks.

14. The encoder according to claim 13, wherein said light transmitting portions comprise a plurality of radially positioned slits.

15. The encoder according to claim 14, wherein said slits are positioned such that said photointerrupters generate pulse signals due to rotation of said rotating shaft.

16. The encoder according to claim 11, wherein said photocouplers are mounted on a surface parallel to said rotating shaft.

17. The encoder according to claim 11, wherein said phase difference between said rotating disks is selected so that signals output from said photocouplers have a phase difference of a quarter phase.

18. The encoder according to claim 11, wherein said light modulating pattern is formed as a plurality of light reflection portions arranged at constant angular intervals on a low reflectivity surface of each of said rotating disks, and wherein each of said photocouplers comprises a photoreflector positioned to detect the light reflected from said light reflecting portions.

19. The encoder according to claim 11, wherein said photocouplers are aligned along a line parallel to an axis of said rotating shaft.

* * * * *

UNITED STATES PATENT AND TRADEMARK OFFICE
CERTIFICATE OF CORRECTION

PATENT NO. : 5,821,531
DATED : October 13, 1998
INVENTOR(S) : Hiroshi Nomura, et. al.

It is certified that error appears in the above-identified patent and that said Letters Patent is hereby corrected as shown below:

Title page, item [54] and col. 1, line 4, of the title, "DIFFERENT" should be --DIFFERENCE--.

Signed and Sealed this

Fourteenth Day of December, 1999

Attest:

Q. TODD DICKINSON

*Attesting Officer*  *Acting Commissioner of Patents and Trademarks*